Figure 1:
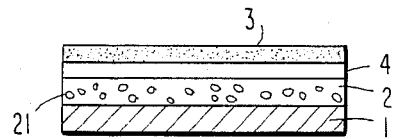

United States Patent [19]

Oishi et al.

[11] Patent Number: 4,492,730
[45] Date of Patent: Jan. 8, 1985

[54] SUBSTRATE OF PRINTED CIRCUIT

[75] Inventors: Naoaki Oishi, Machida; Noriyuki Shimizu, Saitama; Takashi Shoji, Chichibu; Shoji Harada, Asaka, all of Japan

[73] Assignees: Showa Denko Kabushiki Kaisha; Nikkan Industries Co., Ltd., both of Tokyo, Japan

[21] Appl. No.: 479,236

[22] Filed: Mar. 28, 1983

[30] Foreign Application Priority Data

Mar. 26, 1982 [JP] Japan .................................. 57-47075
Mar. 26, 1982 [JP] Japan .................................. 57-47076

[51] Int. Cl.$^3$ ...................... B32B 15/08; B32B 27/36; B32B 27/28
[52] U.S. Cl. .................... 428/328; 428/418; 428/460; 428/458; 428/461; 428/419; 428/473.5; 428/901
[58] Field of Search ............ 428/215, 328, 330, 331, 428/418, 416, 460, 458, 461, 419, 473.5, 500, 480, 413, 524, 901

[56] References Cited

U.S. PATENT DOCUMENTS

| | | | |
|---|---|---|---|
| 2,798,823 | 7/1957 | Harper | 428/330 X |
| 3,278,455 | 10/1966 | Feather | 428/418 X |
| 3,784,440 | 1/1974 | Grunwald et al. | 428/418 X |
| 3,801,427 | 4/1974 | Morishita et al. | 428/329 X |
| 4,009,312 | 2/1977 | Hayashi et al. | 428/215 X |
| 4,205,111 | 5/1980 | Pip et al. | 428/215 |
| 4,264,669 | 4/1981 | Yuan | 428/524 X |
| 4,329,399 | 5/1982 | Swerlick | 428/331 X |

OTHER PUBLICATIONS

Chem. Abstracts 96:218641p-BT resins.

Primary Examiner—George F. Lesmes
Assistant Examiner—Nancy A. B. Swisher
Attorney, Agent, or Firm—Sughrue, Mion, Zinn, Macpeak and Seas

[57] ABSTRACT

The present invention relates to a substrate for a printed circuit exhibiting particularly an excellent electrical insulating property, as well as an excellent heat dissipating property and heat resistance.

In accordance with the present invention, a substrate of a printed circuit comprises a metallic plate, and further comprising on at least one surface of said metallic plate, a synthetic resin layer containing an inorganic filler, a heat-resistant resin film, and a synthetic resin layer, which are successively laminated on said metallic plate.

A substrate of the present invention also comprises a metallic plate, at least two synthetic resin layers containing an inorganic filler, a heat-resistant resin film which is laminated between said at least two synthetic resin layers.

11 Claims, 4 Drawing Figures

SUBSTRATE OF PRINTED CIRCUIT

The present invention relates to a substrate of a printed circuit which is excellent in heat dissipating property, electrical insulating property, heat resistance and the like.

With a tendency toward reduction in the size and thickness of an electronic machine, there is an increasing tendency that a substrate for a printed circuit is mounted with parts at a high packing density.

Under these circumstances, the substrate for a printed circuit is required to meet more strict demands than before with respect to various properties such as heat dissipating property and dimensional stability. Particularly when the substrate is mounted with parts at a high packing density, it is required to exhibit, in addition to satisfactory heat dissipating property, an extremely excellent humidity resistance and smoothness of the substrate surface.

Heretofore, there is known a heat dissipating substrate comprising a base consisting of a metallic plate, for example, an aluminum (Al) plate, and a synthetic resin layer coated on the base surface, the resin layer containing dispersed therein inorganic fillers having high heat conductivity. However, the substrate of this type is disadvantageous in that if the resin layer is too thin, the dielectric strength is unsatisfactory, and, on the other hand, if the resin layer is too thick, the heat dissipating property and the dimensional stability become inferior.

Also, there is known another type of heat dissipating substrate comprising a base consisting of a metallic plate, for example, an aluminum (Al) substrate, and a glass cloth, optionally loaded with an inorganic filler, bonded to the base with a thermosetting resin. These substrates exhibit better dimensional stability than do the above-mentioned type of substrate. The glass cloth is prepared by weaving bundles of glass filaments. Therefore, during the application of the thermosetting resin to the glass cloth, air and solvent are trapped in the filament bundle. When this glass cloth is bonded to the aluminum plate, it is impossible to completely remove the trapped air and solvent. Therefore, the finished product sometimes exhibits an unsatisfactory electrical insulating property, and the occurrence of defective articles is increased. In order to overcome the problem of the above-mentioned unsatisfactory insulating property, the use of a two-layered adhesive laminate and increasing of the deposit of the thermosetting resin are proposed. However, these countermeasures are undesirable from the viewpoint of heat conductivity.

If the purpose is merely to attain a perfect electrical insulating property, a film of a thermoplastic resin can be bonded to the metallic plate by heat-pressing so as to form an insulating layer thereon. In this case, although an excellent electrical insulating property can be attained, the adhesive layer exhibits a poor heat resistance and undergoes deterioration and failure when such a substrate is subjected to a part-mounting procedure (soldering procedure, bonding procedure, etc.) and a high temperature processing procedure. In this case, substituting a thermosetting film having heat resistance for the thermoplastic resin film will remove the problem of the deterioration of the adhesive layer. However, because heat-pressing cannot be used for bonding the thermosetting film, it is necessary to apply a thermosetting resin layer onto both surfaces of the film so as to bond the base metallic plate and a metallic foil for a printed circuit to each corresponding surface. In order to increase the productivity in the practical industrial production, the substrate must be produced in a significantly large size. Therefore, in order to avoid any absence of bonding between the surface of the film and the base metallic plate and of bonding between the other surface of the film and the metallic foil, the thickness of the resin layer must be maintained more than a specific level. The result is a deteriorated heat conductivity.

Under the above-mentioned circumstances, the present invention was accomplished.

An object of the present invention is to provide a substrate for a printed circuit exhibiting particularly an excellent electrical insulating property, as well as an excellent heat dissipating property and heat resistance.

In accordance with the objects of the present invention, there is provided a substrate of a printed circuit comprising a metallic plate, and further comprising on at least one surface of said metallic plate, a synthetic resin layer containing an inorganic filler, a heat-resistant resin film, and a synthetic resin layer, which are successively laminated on said metallic plate.

In accordance with the objects of the present invention, there is also provided a substrate of a printed circuit comprising a metallic plate, at least two synthetic resin layers containing an inorganic filler, a heat-resistant resin film which is laminated between said at least two synthetic resin layers.

A substrate of a printed circuit according to the present invention may further a metal foil on an outer synthetic resin layer.

The present invention is illustrated in detail, below, with reference to the drawings showing an example of the present invention.

Figure 2:
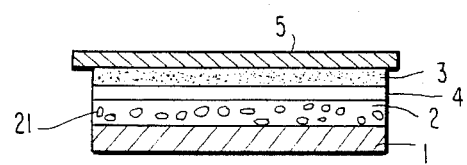

FIGS. 1 and 2 are cross-sectional views of a substrate according to the present invention. In the drawings, the reference numeral 1 denotes a metallic plate and 2 a synthetic resin layer containing therein an inorganic filler 21. The reference numeral 4 denotes a heat-resistant resin film on which a synthetic resin layer 3 is located. The reference numeral 5 denotes a metallic foil.

The metallic plate 1 can be made of a material selected from the group consisting of aluminum (Al), copper (Cu), iron (Fe) and alloys thereof. Aluminum (Al) having a light weight and an excellent heat conductivity is most suitable for practical purposes. The thickness of the metallic plate 1 is variable depending on the end use. Usually, the thickness of the metallic plate 1 is in the range of from 0.5 to 2.5 mm.

It is preferable that the surface of the metallic plate 1 be roughened so as to enhance the bonding property of the metallic plate 1 to the synthetic resin layer 2. However, this surface roughing procedure is unnecessary for specific types of metallic plates. The degree of surface roughness is suitably in the range of from 5 to 40$\mu$ in terms of maximum surface roughness (Rmax). The surface roughing procedure may be carried out either by a mechanical method or by a chemical method.

The resin of which the synthetic resin layer 2 consists is preferably selected from thermosetting resins, for example, epoxy, phenol, polyimide, unsaturated polyester and BT (bismaleimide-triazine) resins. Thermoplastic resins having heat resistance, for example, modified (cross-linked) polyethylene, polysulfonic acid and polyphenylene sulfide, may also be used.

The synthetic resin layer 2 contains the inorganic filler 21. The inorganic filler 21 usable for the synthetic resin layer 2 may be selected from the group consisting of metal oxides, for example, $Al_2O_3$, $SiO_2$, $ZrO_2$, $TiO_2$ and BeO; nitrides, for example, BN, $Si_3N_4$, and AlN; carbides, for example, SiC, TiC and ZrC; and inorganic fibers, for example, unwoven glass fibers and unwoven mineral fibers. The inorganic filler is used for the purpose of enhancing the heat resistivity of the substrate and the electrical insulating property of the substrate is imparted by the heat-resistant resin film 4 described hereinafter. Therefore, powders of metals, for example, Fe, Al, Ni, Cu and Ag, and alloys, powdered carbon, unwoven metallic short fibers and unwoven carbon fibers may also be used as the inorganic filler. These materials are also included within the inorganic filler of the present invention shown by 21 in the drawings.

In order to enhance the adhesion of the inorganic filler to the resin and to enhance the humidity resistance of the resultant printing substrate, the moisture-adsorbing inorganic filler may be subjected to a surface coating treatment before it is incorporated into the resin. The same effect may also be obtained by incorporating a surface treating agent into the resin.

When the inorganic filler is in the form of a particle or powder, the particle size is preferably $30\mu$ or less. Since the particles usually have a particle size distribution, the term "particle size of $30\mu$ or less" usually signifies that 90% or more of the particles has a size of $30\mu$ or less. If the particle size exceeds $30\mu$, the thickness of the inorganic resin layer 2 is increased, which results in not only a decreased heat dissipating property of the resultant substrate but also difficulties in the laminating procedure. However, powdered aluminum sometimes is in the form of a flake. Since the flake is located in a layer form in the resin, it can have a size exceeding $30\mu$.

The volume ratio of the resin to the inorganic filler depends on the desired heat dissipation effect and workability of lamination. It is preferable that the inorganic filler be used in an amount of 10 to 300 parts by volume based on 100 parts by volume of the resin. If the inorganic filler 21 is less than 10 parts by volume, the heat dissipating property of the resultant substrate is not improved to a remarkable extent. Also, if the inorganic filler 21 exceeds 300 parts by volume, the laminating procedure becomes difficult and a satisfactory bonding strength cannot be obtained.

The thickness of the synthetic resin layer 2 containing the inorganic filler 21 is determined in consideration of the bonding strength of the laminated layers 2, 3, 4, the heat dissipating property of the resultant substrate, workability, etc. The synthetic resin layer 2 suitably has a thickness of from 10 to $60\mu$.

The heat-resistant resin film 2 is laminated on the surface of the synthetic resin layer 2. When parts are mounted on the substrate, a soldering procedure is usually involved. Therefore, the resin film must withstand a temperature at which the soldering procedure is carried out. Also, a printed circuit is heated to a significantly high temperature during its use depending on the intended use. For these reasons, it is desirable that the heat-resistant resin film 4 is a heat-resistant film composed of polyimide, polyparabanic acid, or the like. However, a low temperature soldering has been developed recently, and the printed circuit is sometimes not heated to a very high temperature depending on the intended use. In such case, the resin film may be a thermoplastic film, for example, a polyester film.

It is preferable that the thickness of the heat-resistant film 4 be as small as possible so long as no formation of voids occurs and a desired dielectric strength can be retained. Usually, it is preferable that the thickness of the heat-resistant film 4 be in the range of from 10 to $30\mu$ from the viewpoint of production.

The synthetic resin layer 3 is laminated on the film. This synthetic resin layer 3 should be increased in thickness to some degree in order to ensure a satisfactory bonding strength between the resin layer 3 and the metallic foil or plated metal (not shown in FIG. 1) to be deposited on the synthetic resin layer 3. However, since the synthetic resin layer 3 contains no material having an excellent heat conductivity, for example, inorganic fillers, increasing the thickness of the synthetic resin layer 3 to a remarkable extent interferes with the heat conductivity of the resultant substrate. For these reasons, the resin layer 3 has suitably a thickness of from 7 to $40\mu$. Since the resin layer contains no filler, it exhibits a remarkable excellent humidity resistance.

In the case where the substrate has a structure having the metallic foil 5 as shown in FIG. 2, the resin of which the synthetic resin layer 3 is not limited to a specific type so long as it is heat-resistant. For example, epoxy resins, phenolic resins, polyimides, unsaturated polyesters, BT resin and the like can be used as the resin for the synthetic resin layer 3. In the case where the substrate has the structure as shown in FIG. 1 and a circuit is formed on the surface of the synthetic resin layer 3 by plating or the like, an excellent adhesion between the plated metal and the resin should be ensured. For this purpose, the surface of the synthetic resin layer 3 is usually subjected to a roughing treatment. It is preferable that the resin be selected from those of the type which can be easily subjected to the surface roughing treatment.

In the structure shown in FIG. 2, the metallic foil 5 is laminated on the surface of the synthetic resin layer 3. This type of structure can be directly subjected to a printed circuit-forming procedure. The metallic foil 5 is made of conventional metals, for example, copper, aluminum, nickel and tin. The metallic foil has a thickness of from 0.005 to 0.3 mm.

The substrate having such construction can be prepared, for example, by coating one surface of a film with a resin liquid containing inorganic fillers, by laminating the resin liquid-coating surface with a metallic plate, by coating the other surface of the film with a resin liquid, by laminating the resin liquid-coated surface with a metallic foil and by subjecting the resultant laminate to a heat-pressing procedure so as to cure the resin.

The substrate shown in FIG. 1 can be prepared by laminating one surface of a film with a metallic plate in the same manner as mentioned above, by coating the other surface of the film with a resin liquid and by subjecting the resultant laminate to a heat-pressing procedure so as to cure the resin. Finally, the surface of the resin layer is treated with a chemical liquid so as to roughen the surface. Thus, the final product is obtained.

The substrate shown in FIG. 1 has insulating layers 2, 4, 3, on one surface of the metallic plate. Both surfaces of the metallic plate may be provided with the insulating layers in exactly the same manner as mentioned above.

Figure 3:
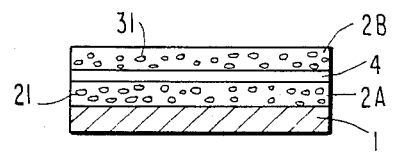
Figure 4:
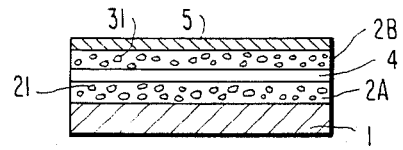

FIGS. 3 and 4 are cross-sectional views of a substrate according to the present invention. In the drawings, the reference numeral 1 denotes a metallic plate and 2A and 2B synthetic resin layers containing therein an inorganic filler 21 and 31, respectively. The reference numeral 4 denotes a heat-resistant resin film on which a synthetic resin layer 2B is located. The reference numeral 5 denotes a metallic foil.

The substrates of a printed circuit shown in FIGS. 3 and 4 are different from those shown in FIGS. 1 and 2, respectively, principally in the point that the outer synthetic resin layer 2B contains inorganic filler 21. Since a printed circuit is formed on the synthetic resin layer 2B, the inorganic filler 31 must be electrically insulative and cannot thus consists of metal, carbon, and carbide. The synthetic resin layer 2B has preferably thickness or from 10 to 60μ.

The substrates of a printed circuit according to the present invention exhibits a high dielectric strength because a film having an excellent electrical insulating property, and they exhibit an improved heat dissipating property because a filler having an excellent heat conductivity is included between the film and the metallic plate. Humidity resistance is high, when the synthetic resin layer on the upper surface of the film contains no filler. Therefore, the substrate of the present invention is suitable for use in applications requiring particularly humidity resistance.

The use of a film in the adhesive layer according to the present invention makes it easy to provide a desired outer shape of a printed circuit board using the substrate of the present invention by subjecting the circuit board itself to drawing and makes it possible to make the corner portions of the printed circuit board more acute than in the case where a glass cloth is used in the adhesive layer. Also, no leak occurs in the processed portions. These features make the substrate of the present invention very useful for use in producing a hand-held calculator having a reduced thickness. Moreover, these features enable the printed circuit board to be used in a curved or folded form as well as in a flat form.

Examples of the present invention and comparative examples are given hereunder for the purpose of clarifying embodiments of the present invention.

The examples are only illustrative, but they by no means limit the purview of the present invention.

EXAMPLE 1

One surface of a polyimide film having a thickness of 25μ was coated with the epoxy resin varnish (compound example 1) described hereinafter in a thickness of 25μ by transfer, and the coated varnish layer was dried by heating it to a temperature of 160° C. Then, a copper foil having a thickness of 35μ was laminated on the varnish layer of the film by means of a laminating machine. α-alumina ($Al_2O_3$) having an average particle size of 4μ and a particle size of up to 15μ was added to the epoxy resin varnish of the compound example 1 in an amount of 100% by weight. The mixture was thoroughly stirred. The other surface of the polyimide film was coated with the resultant varnish in a thickness of 40μ by transfer, and the coated varnish layer was dried by heating it to a temperature of 160° C. so as to prepare an adhesive layer in a semicured state on the film surface.

On the other hand, one surface of an aluminum plate having a thickness of 2 mm was treated with hydrochloric acid to activate the surface. The above-mentioned sheet was laminated on the activated surface of the aluminum plate with the adhesive layer facing the activated surface by a heating laminating machine so as to prepare a copper-laminated aluminum plate.

Resin varnish compound (compound example 1)

| | |
|---|---|
| (1) epoxy resin (AER-661L, manufactured by Asahi Kasei Co., Ltd. | 100 parts |
| (2) dicyandiamide | 4 parts |
| (3) dimethylformamide | 20 parts |
| (4) benzyldimethylamine | 0.3 part |
| (5) methyl ethyl ketone | 100 parts |

EXAMPLE 2

One surface of a polyimide film having a thickness of 25μ was coated with the unsaturated polyester resin varnish (compound example 2) described hereinafter in a thickness of 20μ by transfer and the coated varnish layer was dried by heating it to a temperature of 160° C. Then, a copper foil having a thickness of 70μ was laminated on the varnish layer of the film by means of a laminating machine. Boron nitride (BN) having an average particle size of 8μ and a particle size of up to 25μ and silica ($SiO_2$) having an average particle size of 6μ and a particle size of up to 20μ were added to the unsaturated polyester resin varnish of the compound example 2 in amounts of 30% by weight and 100% by weight, respectively. The mixture was thoroughly stirred. The other surface of the polyimide film was coated with the resultant varnish in a thickness of 40μ by transfer, and the coated varnish layer was dried by heating it to a temperature of 160° C. so as to prepare an adhesive layer in a semicured state on the film surface.

On the other hand, one surface of an aluminum plate having a thickness of 1.5 mm was subjected to a sandblasting treatment to convert the surface to an uneven surface having a concavity depth of 15μ. The above-prepared sheet was placed on the uneven surface of the aluminum plate with the adhesive layer facing the uneven surface. The composite material was then heat-pressed at a temperature of about 160° C. under a pressure of about 40 kg/cm$^2$ so as to prepare a copper-laminated aluminum plate.

Resin varnish compound (compound example 2)

| | |
|---|---|
| (1) unsaturated polyester resin (Polymar X-392, manufactured by Takeda Yakuhin Co., Ltd.) | 100 parts |
| (2) t-butyl perbenzoate | 1 part |

EXAMPLE 3

One surface of a polyparabanic acid film having a thickness of 25μ was coated with the non-solvent epoxy varnish (compound example 3) described hereinafter in a thickness of 20μ by transfer after the varnish was adjusted to a desired temperature. Then, a nickel foil having a thickness of 35μ was laminated on the varnish layer of the film by using a heating roll.

α-alumina ($Al_2O_3$) having an average particle size of 8μ and a particle size of up to 25μ was added to the non-solvent epoxy varnish of the compound example 3 in an amount of 100% by weight. The mixture was thoroughly stirred. The other surface of the polyparabanic acid film was coated with the resultant varnish in a thickness of 40μ.

On the other hand, one surface of an aluminum (Al) plate was activated with hydrochloric acid and the activated surface was anodized so as to form an Alumite layer having a thickness of 9μ thereon. Then, the above-prepared sheet was placed on the Alumite layer of the aluminum plate with the varnish layer facing the Alumite layer. The composite material was heat-pressed by using a pair of heating rolls so as to prepare a nickel-laminated aluminum plate.

Resin varnish compound (compound example 3)

| (1) epoxy resin (Epiklon 850, manufactured by Dainippon Ink Co., Ltd.) | 100 parts |
| (2) curing agent (HN-2200, manufactured by Hitachi Kasei Co., Ltd.) | 79 parts |
| (3) curing promotor (2E4MZ, manufactured by Shikoku Kasei Co., Ltd.) | 0.5 part |

EXAMPLE 4

30 parts of acrylonitrile rubber (trade name: Hiker 1072) were added to the epoxy resin varnish of the compound example 1 to prepare a non-electrolytically plated material-adhering varnish. MEK (methyl ethyl ketone) was further added to the resultant varnish to adjust the viscosity thereof to a predetermined value. One surface of a polyimide film having a thickness of $25\mu$ was coated with the varnish in a thickness of $15\mu$ and the coated varnish layer was dried by heating it to a temperature of 130° C. A release film made of polypropylene was temporarily laminated on the varnish layer of the polyimide film.

Powdered aluminum (Al) having an average particle size of $10\mu$ was added to the epoxy resin varnish of the compound example 1 in an amount of 80% by weight. The mixture was thoroughly stirred. The other surface of the polyimide film was coated with the resultant varnish in a thickness of $50\mu$, and the coated varnish layer was heated to a temperature of 160° C. so as to prepare an adhesive layer in a semicured state on the film surface.

On the other hand, one surface of an aluminum plate was treated with hydrochloric acid to activate the surface. Then, the above-prepared sheet was placed on the activated surface of the aluminum plate with the adhesive layer facing the activated surface. The composite material was heat-pressed to form an insulating layer on the aluminum plate. Thereafter, the above-mentioned release film was removed from the varnish layer to prepare an aluminum-based substrate for an additive process.

Comparative Example 1

The epoxy resin varnish of the compound example 1 was diluted with methyl ethyl ketone to adjust the viscosity of the varnish to an adequate value. A glass cloth (WE-10GBZ-2, manufactured by Nitto-Boseki Co., Ltd.) was impregnated with the resultant varnish. The impregnated glass cloth was dried by heating it to a temperature of about 160° C. so as to prepare a sheet in a semicured state having a thickness of $110\mu$. Separately, one surface of an aluminum plate having a thickness of 2 mm was treated with hydrochloric acid to activate the surface. The above-prepared sheet was placed on the activated surface of the aluminum plate. Subsequently, a copper foil having a thickness of $35\mu$ was placed on the sheet. The resultant composite material was heat-pressed at a temperature of about 160° C. under a pressure of about 40 kg/cm$^2$ so as to prepare a copper-laminated aluminum plate.

Comparative Example 2

Both surfaces of a polyimide film having a thickness of $25\mu$ were coated with the epoxy resin varnish of the compound example 1 in a thickness of $40\mu$. The coated varnish layers were dried by heating it to a temperature of 160° C. so as to prepare a sheet having adhesive layers in a semicured state on both surfaces thereof.

Separately, one surface of an aluminum plate having a thickness of 1.5 mm was treated with hydrochloric acid to activate the surface. The above-prepared sheet was placed on the activated surface of the aluminum plate. A copper foil having a thickness of $70\mu$ was further placed on the sheet. Then, the resultant composite material was heat-pressed at a temperature of about 160° C. under a pressure of about 40 kg/cm$^2$ so as to prepare a copper-laminated aluminum plate.

Comparative Example 3

A polyethylene film having a thickness of $50\mu$ was placed on the hydrochloric acid-activated surface of an aluminum plate having a thickness of 1.5 mm. A copper foil having a thickness of $35\mu$ was further placed on the polyethylene film. The laminated layers were fused with each other by using a pair of heat-pressing rolls so as to prepare a copper-laminated aluminum plate.

Comparative Example 4

α-alumina (Al$_2$O$_3$) having an average particle size of $4\mu$ was added to the epoxy resin varnish of the compound example 1 in an amount of 100% by weight. The mixture was thoroughly stirred. One surface of a copper foil having a thickness of $35\mu$ was coated with the resultant varnish in a thickness of $80\mu$ so as to prepare an adhesive layer thereon. The resultant copper foil was placed on the hydrochloric acid-activated surface of an aluminum plate having a thickness of 1.5 mm with the adhesive layer of the copper foil facing the activated surface of the aluminum plate. The laminated layers were heat-pressed by using a pair of heating rolls so as to prepare a copper-laminated aluminum plate.

Test result

The results of the tests carried on the properties of the substrates of the above-mentioned examples and comparative examples are indicated in the following table.

TABLE 1

| | Surface Resistance (Ω) | | Resistance to Heat of Soldering 260° C. 20 sec | Break-down Voltage KV | Heat Conductivity Cal/cm/sec/°C. |
|---|---|---|---|---|---|
| | C-96 hrs/ 20° C./65% RH | C-96 hrs/ 20° C./65% RH +C-96 hrs/ 40° C./90% RH | | | |
| Example 1 | $4.0 \times 10^{13}$ | $1.6 \times 10^{11}$ | Pass | 13.0 | $1.84 \times 10^{-3}$ |
| Example 2 | $1.9 \times 10^{13}$ | $7.0 \times 10^{10}$ | " | 13.5 | $1.76 \times 10^{-3}$ |
| Example 3 | $6.0 \times 10^{13}$ | $2.3 \times 10^{11}$ | " | 12.0 | $1.86 \times 10^{-3}$ |
| Example 4 | $5.5 \times 10^{13}$ | $1.6 \times 10^{10}$ | " | 12.5 | $1.62 \times 10^{-3}$ |
| Comparative Example 1 | $3.5 \times 10^{13}$ | $4.0 \times 10^{11}$ | Pass | 3.5 | $1.03 \times 10^{-3}$ |

TABLE 1-continued

| | Surface Resistance (Ω) | | Resistance to Heat of Soldering 260° C. 20 sec | Breakdown Voltage KV | Heat Conductivity Cal/cm/sec/°C. |
|---|---|---|---|---|---|
| | C-96 hrs/ 20° C./65% RH | C-96 hrs/ 20° C./65% RH +C-96 hrs/ 40° C./90% RH | | | |
| Comparative Example 2 | $1.6 \times 10^{13}$ | $1.8 \times 10^{12}$ | " | 13.0 | $7.06 \times 10^{-4}$ |
| Comparative Example 3 | $1.2 \times 10^{14}$ | $1.2 \times 10^{12}$ | Failure | 10.0 | $9.06 \times 10^{-4}$ |
| Comparative Example 4 | $7.2 \times 10^{13}$ | $2.5 \times 10^{10}$ | Pass | 3.0 | $1.92 \times 10^{-3}$ |

Note: The test was carried out based on JIS C-6481.

EXAMPLE 5

The procedure of Example 1 was repeated except that the resultant varnish was applied on the both surfaces of the polyimide film, and then this film and a 35μ thick copper foil were successively placed on the aluminum plate and were thermally pressure bonded at approximately 160° C. under a pressure of approximately 40 kg/cm².

EXAMPLE 6

α-alumina ($Al_2O_3$) particles having an average particle size of 8μ, and a particle size of up to 25μ were surface-treated with a silane-coupling agent. 100 parts by weight of these particles are well mixed with the varnish compound example 1, and the mixture was well stirred. MEK (methyl ethyl ketone) was further added to the resultant mixture so as to adjust the viscosity thereof to a predetermined value. Both surfaces of the 25μ thick polyparabanic acid film were coated with the mixture in a thickness of 50μ and the coated varnish layer was dried by heating it to a temperature of 160° C. so as to prepare dual adhesive layer in a semicured state on the film surface.

On the other hand, one surface of an aluminum plate having a thickness of 2 mm was subjected to a sandblasting treatment to activate the surface. The above-prepared adhesive layer was placed on the aluminum plate with the adhesive layer facing the activated surface. A 70μ thick aluminum foil was laminated on the adhesive layer. The composite material was then heat-pressed at a temperature of about 160° C. under a pressure of about 40 kg/cm² so as to prepare a copper-laminated aluminum plate.

EXAMPLE 7

BN (boronnitride) having an average particle size of 4μ and a particle size of up to 30μ was added to the non-solvent epoxy varnish of the compound example 3 in an amount of 100% by weight. The mixture was thoroughly stirred. A 25μ polyimide film was passed through the mixture, the temperature and thus viscosity of which being adjusted constant, so as to form 40μ thick adhesive layers on both sides thereof. The polyimide film was then pulled onto a 2 mm thick aluminum plate, the surface of which being activated by hydrochloric acid. A 35μ thick copper foil was placed on the polyimide film. The composite material was then heat-pressed under a pressure so as to prepare a copper-laminated aluminum plate.

EXAMPLE 8

α-alumina ($Al_2O_3$) having an average particle size of 8μ and a particle size of up to 25μ weight and silica ($SiO_2$) having an average particle size of 6μ and a particle size of up to 20μ weight were added to the unsaturated polyester resin varnish of the compound example 2 in amounts of 50% by weight and 50% by weight, respectively. The mixture was thoroughly stirred. The both surfaces of the polyimide film was coated with the resultant varnish in a thickness of 40μ.

On the other hand, one surface of an aluminum (Al) plate was activated with hydrochloric acid and the activated surface was anodized so as to form an Alumite layer having a thickness of 9μ thereon. Then, the above-prepared sheet was placed on the Alumite layer of the aluminum plate with the varnish layer facing the Alumite layer. The composite material was heat-pressed at approximately 160° C. under a pressure of 40 kg/cm² so as to prepare a nickel-laminated aluminum plate.

EXAMPLE 9

30 parts of acrylonitrile rubber (trade name: Hiker 1072) were added to the epoxy resin varnish of the compound example 1 to prepare a non-electrolytically plated material-adhering varnish. 100 parts by weight of α-alumina ($Al_2O_3$) having an average particle size of 4μ and MEK (methyl ethyl ketone) was further added to the resultant varnish to adjust the viscosity thereof to a predetermined value. One surface of a polyimide film having a thickness of 25μ was coated with the varnish in a thickness of 30μ and the coated varnish layer was dried by heating it to a temperature of 130° C. A release film made of polypropylene was temporarily laminated on the varnish layer of the polyimide film.

Powdered aluminum (Al) having an average particle size of 40μ was added to the epoxy resin varnish of the compound example 1 in an amount of 80% by weight. The mixture was thoroughly stirred. The other surface of the polyimide film was coated with the resultant varnish in a thickness of 50μ, and the coated varnish layer was heated to a temperature of 160° C. so as to prepare an adhesive layer in a semicured state on the film surface.

On the other hand, one surface of a 2 mm thick aluminum plate was treated with hydrochloric acid to activate the surface. Then, the above-prepared sheet was placed on the activated surface of the aluminum plate with the adhesive layer facing the activated surface. The composite material was heat-pressed to form an insulating layer on the aluminum plate. Thereafter, the above-mentioned release film was removed from the varnish layer to prepare an aluminum-based substrate for an additive process.

Comparative Example 5

MEK (methyl ethy ketone) was further added to the epoxy resin varnish of the compound example 1 to adjust the viscosity thereof to a predetermined value. The resultant varnish was impregnated in a glass cloth (WE-10GBZ-2, manufactured by Nitto-Boseki Co., Ltd.) and the impregnated glass cloth was dried by heating it to a temperature of about 160° C. so as to prepare a sheet having a thickness of 110μ. Separately, one surface of an aluminum plate having a thickness of 2 mm was treated with hydrochloric acid to activate the surface. The above-prepared sheet was placed on the activated surface of the aluminum plate. Subsequently, a copper foil having a thickness of 35μ was placed on the sheet. The resultant composite material was heat-pressed at a temperature of about 160° C. under a pressure of about 40 kg/cm² so as to prepare a copper-laminated aluminum plate.

TABLE 2

|  | Surface Resistance (Ω) | | Resistance to Heat of Soldering 260° C. 20 sec | Breakdown Voltage KV | Heat Conductivity Cal/cm/sec/°C. |
| --- | --- | --- | --- | --- | --- |
|  | C-96 hrs/ 20° C./65% RH | C-96 hrs/ 20° C./65% RH +C-96 hrs/ 40° C./90% RH |  |  |  |
| Example 5 | $4.2 \times 10^{14}$ | $1.8 \times 10^{11}$ | Pass | 13.0 | $2.32 \times 10^{-3}$ |
| Example 6 | $3.8 \times 10^{14}$ | $2.6 \times 10^{12}$ | " | 13.0 | $2.01 \times 10^{-3}$ |
| Example 7 | $1.7 \times 10^{14}$ | $1.6 \times 10^{11}$ | " | 13.5 | $2.26 \times 10^{-3}$ |
| Example 8 | $1.6 \times 10^{13}$ | $2.3 \times 10^{11}$ | " | 12.5 | $1.96 \times 10^{-3}$ |
| Example 9 | $5.5 \times 10^{13}$ | $1.6 \times 10^{11}$ | " | 12.5 | $1.83 \times 10^{-3}$ |
| Comparative Example 5 | $3.5 \times 10^{13}$ | $4.0 \times 10^{11}$ | Failure | 3.5 | $1.03 \times 10^{-3}$ |

We claim:

1. A substrate of a printed circuit comprising a metallic plate, and further comprising on at least one surface of said metallic plate, (a) a synthetic resin layer containing an inorganic filler in an amount of from 10 to 300 parts by volume based on 100 parts by volume of synthetic resin, (b) a heat-resistant resin film wherein said heat-resistant resin film consists of a material selected from the group consisting of polyimide, polyparabanic acid and polyester, and (c) a synthetic resin layer free of inorganic filler, wherein each of said layers (a), (b) and (c) are successively laminated on said metallic plate, and wherein the resin of said synthetic resin layers (a) and (c) are selected from the group consisting of epoxy, phenol, polyimide, unsaturated polyester, BT resins, modified polyethylene, polysulfonic acid and polyphenylene sulfide.

2. A substrate of a printed circuit comprising a metallic plate, and further comprising on at least one surface of said metallic plate (a) at least two synthetic resin layers containing an inorganic filler in an amount of from 10 to 300 parts by volume based on 100 parts by volume of synthetic resin, (b) a heat-resistant resin film wherein said heat-resistant resin film consists of a material selected from the group consisting of polyimide, polyparabanic acid and polyester laminated between said at least two synthetic resin layers (a) and (c), wherein the resin of said synthetic resin layers (a) and (c) are selected from the group of epoxy, phenol, polyimide, unsaturated polyester, BT resins, modified polyethylene, polysulfonic acid and polyphenylene sulfide, and wherein said inorganic filler, which is contained in synthetic resin layer (a) on the heat-resistant film (b) is an insulator.

3. A substrate of a printed circuit according to claim 1, further comprising a metal foil on an outer synthetic resin layer.

4. A substrate of a printed circuit according to claim 1 or 2, wherein said inorganic filler consists of at least one member selected from the group consisting of $Al_2O_3$, $SiO_2$, $ZrO_2$, $TiO_2$, BeO, BN, $Si_3N_4$, AlN, SiC, TiC, and ZrC.

5. A substrate of a printed circuit according to claim 1 or 2, wherein said inorganic filler consists of unwoven inorganic fibers.

6. A substrate of a printed circuit according to claim 1 or 2, wherein metal or alloy is contained as said inorganic filler in the synthetic resin layer which is formed beneath said heat-resistant resin film.

7. A substrate of a printed circuit according to claim 1 or 2, wherein carbon is contained as said inorganic filler in the synthetic resin layer which is formed beneath said heat-resistant resin film.

8. A substrate of a printed circuit according to claim 1 or 2, wherein 90% or more of said inorganic filler is in the form of a particle or powder having size of 30μ or less.

9. A substrate of a printed circuit according to claim 1, wherein said inorganic filler is in the form of a flake.

10. A substrate of a printed circuit according to claim 1 or 2, wherein thickness of said heat-resistant film is from 10 to 30μ.

11. A substrate of a printed circuit according to claim 1 or 2, wherein each of said synthetic resin layers has a thickness of from 10 to 60μ.

* * * * *